United States Patent [19]

Sato

[11] Patent Number: 5,030,331
[45] Date of Patent: Jul. 9, 1991

[54] PROCESS FOR PREPARING IRIDIUM OXIDE FILM

[75] Inventor: Yoshiyuki Sato, Ikeda, Japan
[73] Assignee: Agency of Industrial Science & Technology, Tokyo, Japan
[21] Appl. No.: 420,061
[22] Filed: Oct. 11, 1989

[30] Foreign Application Priority Data

Nov. 11, 1988 [JP] Japan .................. 63-286433

[51] Int. Cl.⁵ .................. C25D 5/00; C23C 14/34
[52] U.S. Cl. .................. 204/38.3; 204/56.1; 204/192.15; 427/35
[58] Field of Search .......... 204/38.3, 56.1, 192.15, 204/192.22, 192.29; 427/35, 37, 38, 126.5

[56] References Cited

U.S. PATENT DOCUMENTS 4,191,453 3/1980 Beni .................. 350/357
4,258,984 3/1981 Beni .................. 350/357

OTHER PUBLICATIONS

Journal of the Electrochemical Society, vol. 134, No. 3,570–575 (1987).

*Primary Examiner*—Nam X. Nguyen
*Attorney, Agent, or Firm*—Armstrong, Nikaido, Marmelstein, Kubovcik & Murray

[57] ABSTRACT

The present invention provides a process for preparing an iridium oxide film which comprises evaporating iridium and carbon by electron beam or sputtering to prepare an iridium-carbon composite film, heating said composite film in an oxidizing atmosphere to form a thermally oxidized iridium oxide film, and continuously applying an alternating potential to said iridium oxide film in an aqueous solution to conduct electrolytic oxidation.

4 Claims, 1 Drawing Sheet

PROCESS FOR PREPARING IRIDIUM OXIDE FILM

BACKGROUND OF THE INVENTION

The present invention relates to a process for preparing an iridium oxide film.

A phenomenon wherein a substance in the form of a thin film brings about a visual change from one color to another color or changes between colored and bleached states through injection of ions having positive or negative charges is called "electrochromism". This phenomenon has been utilized, e.g., for an electrochromic device. Examples of known inorganic materials which color anodically by an oxidation process include metallic oxides such as iridium oxide, rhodium oxide, nickel oxide, and cobalt oxide. Among them, iridium oxide has advantages such as high response speed and excellent chemical stability and therefore is under the most energetic investigation.

Examples of the method of preparing an iridium oxide film known in the art include (1) an anodic oxidation method and (2) a reactive sputtering method. Method (1), i.e., the anodic oxidation method comprises forming an iridium film on a substrate by sputtering or vacuum deposition and anodizing the iridium film in a sulfuric acid solution to prepare an iridium oxide film.

Method (2), i.e., the reactive sputtering method comprises conducting sputtering in an $O_2$ atmosphere or an $O_2/Ar$ atmosphere through the use of metallic iridium as a target to prepare an iridium oxide film.

However, method (1) is disadvantageous in that when the surface area of the film is large, it is impossible to form a homogeneous iridium oxide film all over the surface, and has further disadvantages such as leaching of iridium into a sulfuric acid solution and the necessity of a long period of time for the formation of iridium oxide.

Method (2) had a drawback that since the optimum deposition rate for forming an iridium oxide film was as low as 10 Å/min, it took 1 hr or longer to form a thin film necessary for use as a display device, e.g., an iridium oxide film having a thickness of about 900 Å. Further, besides the above-described methods (1) and (2), method (3) wherein an iridium film is heated to form an iridium oxide film can be also considered as theoretically possible. However, the iridium oxide film disadvantageously crystallizes upon being heated to 300° C. or above to lose its electrochromic characteristics. On the other hand, no iridium oxide can be formed when iridium per se is heated at 300° C. or below.

For these reasons, in order to improve method (3), a proposal has been made on a method wherein a composite film comprising metallic iridium and carbon is heated and oxidized at about 250° C. to prepare iridium oxide (see Japanese Patent Publication No. 62-57707).

However, the iridium oxide film prepared by this method cannot be completely bleached by an electrochemical process and disadvantageously brings about the so-called "residual coloration" in a bleached state. This unfavorably lowered the quality as a display when the iridium oxide film was used as a display device.

SUMMARY OF THE INVENTION

A first object of the present invention is to provide a process for preparing an iridium oxide film which colors anodically by an oxidation process, i.e., colors in an oxidized state.

A second object of the present invention is to provide a process for preparing an iridium oxide film which exhibits very high transmittance in a bleaching state and hardly brings about "residual coloration."

The above-described objects can be attained by evaporating iridium and carbon by electron beam or sputtering to prepare an iridium-carbon composite film, heating said composite film in an oxidizing atmosphere to form a thermally oxidized iridium oxide film, and continuously applying an alternating potential to said iridium oxide film in an aqueous solution to conduct electrolytic oxidation.

DESCRIPTION OF THE PREFERRED EMBODIMENTS

Figure 1:
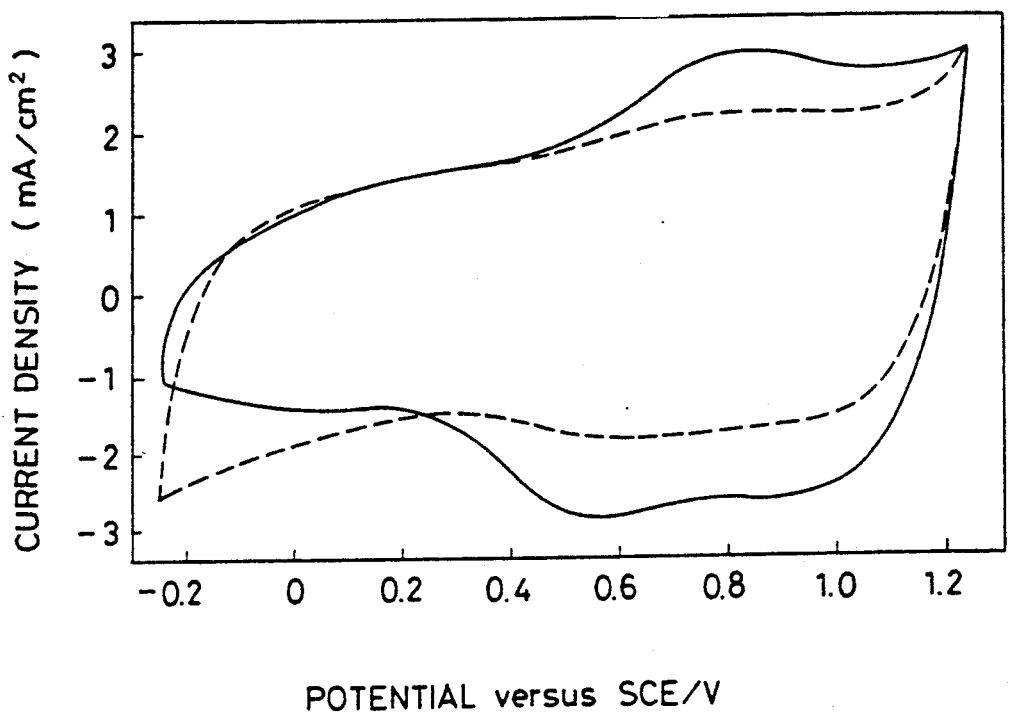
FIG. 1 is a graph showing a change in the current density with a change in the potential of an iridium oxide film before and after electrolytic oxidation in Example 1.

In the process according to the present invention, an iridium-carbon composite film is formed on a substrate. This composite film can be prepared by the following methods which have been commonly adopted in the art for preparation of a thin film.

(i) An electron beam binary deposition method wherein iridium and carbon are evaporated from different evaporation sources by an electron beam to form a composite film on the same substrate.

(ii) A method wherein iridium is placed in a graphite crucible and carbon is evaporated together with iridium to form a composite film on a substrate.

(iii) A method wherein sputtering is conducted in an argon gas with iridium as a target provided on carbon.

The composition ratio of iridium to carbon in the iridium-carbon composite film is preferably 0.05 to 0.30 in terms of an iridium to carbon ratio [Ir:C (atomic ratio)]. It is possible to prepare a composite film having a composition ratio falling within the above-described range through control of the weight ratio of iridium to carbon in the evaporation source. When the composition ratio of iridium to carbon is outside the above-described range, the elimination of carbon from the composite film becomes insufficient in thermal oxidation which will be described later, which unfavorably leads to formation of only a film having low transmittance.

A suitable thickness of the composite film is usually 100 to 2000 Å.

Besides conductive materials, e.g., metals, non-conductive materials such as glass, porcelain and synthetic resins may also be used as the substrate for forming an iridium-carbon composite film. However, since energization is necessary in an anodic oxidation process, it is preferred to preliminarily provide a transparent conductive film, a conductive metal film or the like on a substrate when a non-conductive substrate is used.

Then, the iridium-carbon composite film formed on the substrate is thermally oxidized according to a method described in, e.g., Japanese Patent Publication No. 62-57707 to prepare a thermally oxidized iridium oxide film.

There is no particular limitation on the atmosphere for thermal oxidation as long as it is an oxidizing atmosphere capable of providing oxidation of iridium. In general, heating in the air suffices for this purpose. Besides this, it is also possible to adopt heating in, e.g., an oxygen-rich atmosphere, in an oxygen- and steam-rich atmosphere, etc. The heating is conducted at a temperature of 225° to 350° C., preferably 240° to 260° C. for usually about 5 to 30 min, preferably 10 to 20 min. Finally, the resultant thermally oxidized iridium oxide film is subjected to electrolytic oxidation. The electrolytic oxidation is conducted by repeatedly applying an alternating potential to the thermally oxidized iridium oxide film in continuous manner.

This electrolytic oxidation causes the oxidation of metallic iridium remaining in the thermally oxidized iridium oxide film to proceed to form a uniform oxidized iridium film, which contributes to a remarkable reduction in the "residual coloration" phenomenon.

By contrast, when anodic oxidation is conducted by merely applying an oxidation potential, the oxidation of the remaining metallic iridium does not sufficiently proceed, so that it is impossible to sufficiently reduce the "residual coloration."

The electrolytic oxidation in the present invention can be conducted in various aqueous solutions employed in usual anodic oxidation of metallic iridium, and examples of the aqueous solution include an aqueous sulfuric acid solution, an aqueous sodium hydroxide solution, an aqueous sodium carbonate solution, an aqueous lithium perchlorate solution, and a mixed aqueous solution comprising lithium perchlorate and lithium hydroxide. There is no particular limitation on the concentration of these aqueous solutions, and the concentration may be substantially the same as that of usual electrolyte for anodic oxidation of metallic iridium. For example, it is possible to employ an aqueous sulfuric acid solution having a concentration of about 0.1 to 1 mol/l, an aqueous sodium hydroxide solution having a concentration of about 0.05 to 0.2 mol/l, preferably about 0.1 mol/l, an aqueous sodium carbonate solution having a concentration of about 0.05 to 0.2 mol/l, preferably about 0.1 mol/l, an aqueous lithium perchlorate solution having a concentration of about 0.1 to 1.0 mol/l, preferably about 1.0 mol/l, and a mixed aqueous solution having a lithium perchlorate concentration of about 0.1 to 1.0 mol/l, preferably about 1.0 mol/l, and a lithium hydroxide concentration of about 0.05 to 0.2 mol/l, preferably about 0.1 mol/l.

The upper limit of the alternating potential to be applied may be properly determined depending upon the kind of electrolyte used and usually in the range of +1.25 V to +1.6 V based on the hydrogen generation potential in the electrolyte used. On the other hand, the lower limit of the alternating potential is preferably in the range of −0.1 V to +0.25 V based on the hydrogen generation potential in the electrolyte used.

There is no particular limitation on the method of potential scanning, and examples of the potential scanning method include a method wherein the potential scanning is conducted with a continuous wave having various waveforms such as triangular wave or sine wave and a method wherein a pulse potential is applied by a square wave. The frequency of the potential scanning may be usually 0.033 to 0.5 Hz, preferably 0.05 to 0.1 Hz in the case of a continuous wave and 0.1 to 1.0 Hz, preferably 0.3 to 0.7 Hz in the case of a square wave.

The electrolyte may be used at a raised temperature up to 50° C. However, as the solution temperature increases, iridium becomes susceptible to leaching. Therefore, it is usually suitable to use the electrolyte at room temperature, i.e., 10° to 25° C.

The electrolytic oxidation time may be properly adjusted depending upon the film thickness and usually 1 to 30 min, preferably 5 to 25 min in the case of an iridium oxide film having a thickness of 100 to 2000 Å. When the electrolysis time is too short, the oxidation of metallic iridium remaining in the thermally oxidized film becomes insufficient. On the other hand, when electrolysis time is long, careful operation is necessary because of progress of etching of the film. When the electrolytic oxidation is conducted with a pulse potential of a square wave, the rate of oxidation is higher than that of the electrolytic oxidation with a continuous wave. However, in this case, the rate of etching of the film is also higher. Therefore, when the film thickness is 100 to 2000 Å, the electrolysis time is preferably 1 to 5 min.

As described above, the process for preparing an iridium oxide film according to the present invention exhibits the following effects.

(1) It is possible to prepare an iridium oxide film which exhibits excellent electrochromism.

(2) The formed iridium oxide film exhibits only a very low degree of "residual coloration" in a bleached state.

(3) In the process of the present invention, an iridium oxide film can be formed in a shorter treating time than that necessary for the conventional method wherein an iridium film is subjected to anodic oxidation. Further, in the present invention, iridium can be more usefully utilized because the amount of leaching of iridium in the electrolyte is smaller.

(4) Therefore, the iridium oxide film prepared according to the process of the present invention remarkably colors anodically by an oxidation process, which renders it very useful as an electrochromic device, a thin-film battery, etc.

Examples of the present invention will now be described.

EXAMPLE 1

Powdery iridium was placed in a graphite crucible, and electron beam deposition was conducted under conditions of an acceleration voltage of 6 kV, an emission current of 180 to 200 mA, and a degree of vacuum of $1 \times 10^{-5}$ to $2 \times 10^{-5}$ Torr to form an about 1000 Å-thick iridium-carbon composite film [iridium : carbon (atomic ratio) = about 1:10 to 1:5] on a transparent tin oxide electrode.

Then, this composite film was heated in the air at 250° C. for 10 min to form a thermally oxidized iridium oxide film. The thermally oxidized iridium oxide film thus formed was immersed in a 0.5 mol/l aqueous sulfuric acid solution. A triangular wave having a frequency of 0.033 Hz (period: 30 sec) was applied at a potential ranging from −0.25 to 1.25 V by making use of a saturated calomel electrode as a reference electrode, and potential scanning was repeated 70 times to conduct electrolytic oxidation, thereby preparing an iridium oxide film.

Figure 2:
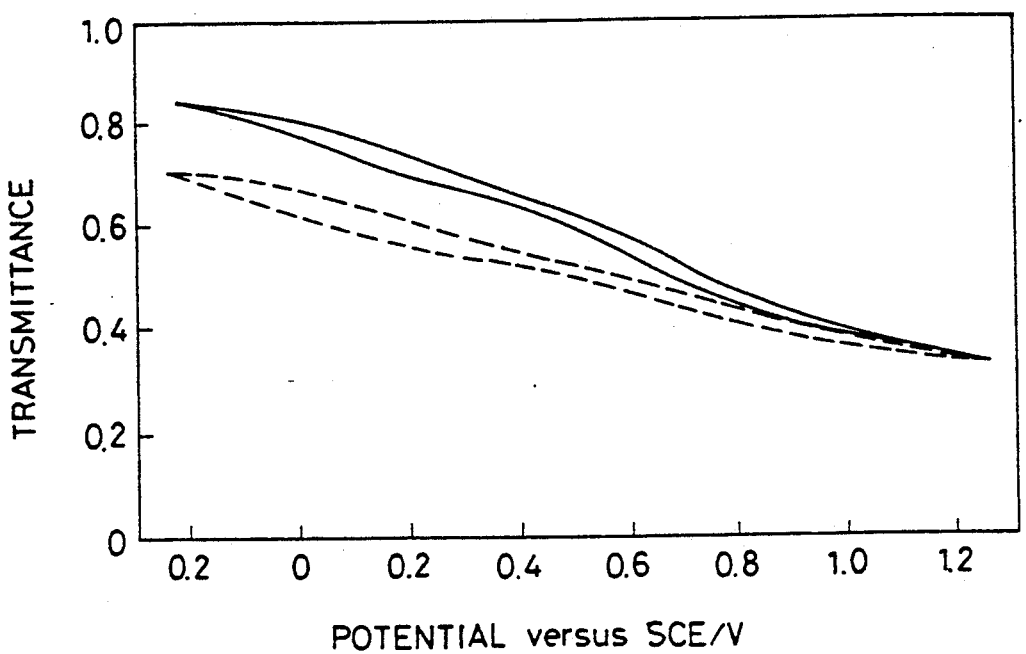
FIG. 2 is a graph showing a change in the transmittance with a change in the potential of an iridium oxide film before and after electrolytic oxidation in Example 1.

The iridium oxide film thus prepared was immersed in an aqueous sulfuric acid solution, and the potential scanning was conducted in the range of 1 to −0.2 V by making use of a saturated calomel electrode as a reference electrode. Consequently, the thin film exhibited changes between colored and bleached states. FIG. 1 is a graph showing a change in the current density during potential scanning, and FIG. 2 is a graph showing a change in the transmittance during potential scanning. The potential scanning speed was 100 mV/sec, and the transmittance was measured at a wavelength of 633 nm. The transmittance of an electrolytic cell measured before immersion of the iridium oxide film was supposed to be 1.0.

In the drawings, a solid line represents the results of measurement for a thin film subjected to electrolytic oxidation, and a broken line represents the results of measurement for a thin film subjected to only thermal oxidation but not subjected to electrolytic oxidation. As is apparent from FIG. 1, as compared with the current density before electrolysis, an increase in the density of a current flowing through the film is observed particularly in a potential ranging from 0.4 to 1.0 V after electrolysis, which substantiates an increase in the amount of iridium oxide contributing to the changes between colored and bleached states.

Further, as is apparent from FIG. 2, the transmittance in a bleached state was very high, while in a colored state substantially no difference in the transmittance was observed between the thin film subjected to electrolytic oxidation and the thin film not subjected to electrolytic oxidation. For this reason, the contrast ratio (transmittance in a breached state/transmittance in a colored state) of the thin film subjected to electrolytic oxidation was as large as 2.1. In FIG. 2, the transmittance of the electrolytic cell was supposed to be 1.0. However, the transparent tin oxide electrode was not completely clear and the transmittance of the transparent electrode per se in an aqueous sulfuric acid solution was about 88%, so that the transmittance of the iridium oxide film per se in a bleached state after electrolytic oxidation was 0.93.

Further, the intensity ratio of iridium Ir-Lα radiation from the thin film before and after electrolytic oxidation was measured. As a result, it has been found that the intensity ratio after electrolytic oxidation was about 0.98, i.e., the amount of leaching of iridium into the aqueous sulfuric solution was very small.

EXAMPLE 2

An iridium oxide film was prepared in the same manner as that of Example 1, except that the potential was applied with a triangular wave having a frequency of 0.067 Hz (period: 15 sec) and the potential scanning was repeated 70 times.

The transmittance of the resultant iridium oxide film in a bleached state was 0.93 based on that of a transparent tin oxide electrode, and the contrast ratio was 1.0. The fluorescent X-ray intensity ratio of Ir-Lα radiation from the thin film before and after electrolytic oxidation was 0.99.

EXAMPLE 3

An iridium oxide film was prepared in the same manner as that of Example 1, except that the potential was applied with a triangular wave having a frequency of 0.167 Hz (period: 6 sec) and the potential scanning was repeated 150 times.

The transmittance of the resultant iridium oxide film in a bleached state was 0.84 based on that of a transparent tin oxide electrode, and the contrast ratio was 1.8. The intensity ratio of Ir-Lα radiation from the thin film before and after electrolytic oxidation was 0.99.

EXAMPLE 4

An iridium oxide film was prepared in the same manner as that of Example 1, except that the potential was applied with a sine wave having a frequency of 0.033 Hz (period: 30 sec) and the potential scanning was repeated 26 times.

The transmittance of the resultant iridium oxide film in a bleached state was 0.94 based on that of a transparent tin oxide electrode, and the contrast ratio was 2.0. The intensity ratio of Ir-Lα radiation from the thin film before and after electrolytic oxidation was 0.96.

EXAMPLE 5

An iridium oxide film was prepared in the same manner as that of Example 1, except that the potential was applied with a sine wave having a frequency of 0.067 Hz (period: 15 sec) and the potential scanning was repeated 50 times.

The transmittance of the resultant iridium oxide film in a bleached state was 0.93 based on that of a transparent tin oxide electrode, and the contrast ratio was 2.1. The intensity ratio of Ir-Lα radiation from the thin film before and after electrolytic oxidation was 0.97.

EXAMPLE 6

An iridium oxide film was prepared in the same manner as that of Example 1, except that the potential was applied with a sine wave having a frequency of 0.167 Hz (period: 6 sec) and the potential scanning was repeated 60 times.

The transmittance of the resultant iridium oxide film in a bleached state was 0.93 based on that of a transparent tin oxide electrode, and the contrast ratio was 2.0. The intensity ratio of Ir-Lα radiation from the thin film before and after electrolytic oxidation was 0.97.

EXAMPLE 7

An iridium oxide film was prepared in the same manner as that of Example 1, except that the potential was applied with a square wave having a frequency of 0.5 Hz (period: 2 sec) and the potential scanning was repeated 100 times.

The transmittance of the resultant iridium oxide film in a bleached state was 0.92 based on that of a transparent tin oxide electrode, and the contrast ratio was 2.1. The intensity ratio of Ir-Lα radiation from the thin film before and after electrolytic oxidation was 0.95.

What is claimed is:

1. A process for preparing an iridium oxide film which comprises evaporating iridium and carbon by electron beam or sputtering to prepare an iridiumcarbon composite film, heating said composite film in an oxidizing atmosphere to form a thermally oxidized iridium oxide film, and continuously applying an alternating potential to said iridium oxide film in an aqueous solution to conduct electrolytic oxidation.

2. A process according to claim 1 wherein the atomic ratio of iridium to carbon (Ir : C) in said iridium-carbon composite film is 0.05 to 0.30.

3. A process according to claim 1, wherein the heating temperature in said oxidizing atmosphere is 225° to 350° C.

4. A process according to claim 1 wherein the upper limit and the lower limit of said alternating potential are +1.25 to +1.6 V and −0.1 to +0.25 V, respectively.

* * * * *